(12) United States Patent
Ishikawa et al.

(10) Patent No.: US 9,805,998 B2
(45) Date of Patent: *Oct. 31, 2017

(54) LIQUID SEALING MATERIAL AND ELECTRONIC COMPONENT USING SAME

(71) Applicant: NAMICS Corporation, Niigata (JP)

(72) Inventors: Seiichi Ishikawa, Niigata (JP); Haruyuki Yoshii, Niigata (JP); Kazuyuki Kohara, Niigata (JP)

(73) Assignee: Namics Corporation, Niigata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/416,045

(22) PCT Filed: May 15, 2013

(86) PCT No.: PCT/JP2013/063532
§ 371 (c)(1),
(2) Date: Jan. 20, 2015

(87) PCT Pub. No.: WO2014/013780
PCT Pub. Date: Jan. 23, 2014

(65) Prior Publication Data
US 2015/0175856 A1   Jun. 25, 2015

(30) Foreign Application Priority Data

Jul. 20, 2012 (JP) .................................. 2012-161596

(51) Int. Cl.

| | |
|---|---|
| *H01L 23/29* | (2006.01) |
| *C08L 63/00* | (2006.01) |
| *C09J 163/00* | (2006.01) |
| *C08K 3/36* | (2006.01) |
| *C08K 9/06* | (2006.01) |
| *C08K 5/5419* | (2006.01) |
| *C08G 59/24* | (2006.01) |
| *C08G 59/50* | (2006.01) |
| *C09J 11/04* | (2006.01) |
| *C09J 11/06* | (2006.01) |
| *C08K 5/09* | (2006.01) |
| *C08K 5/18* | (2006.01) |

(52) U.S. Cl.
CPC .......... *H01L 23/295* (2013.01); *C08G 59/245* (2013.01); *C08G 59/50* (2013.01); *C08K 3/36* (2013.01); *C08K 5/5419* (2013.01); *C08L 63/00* (2013.01); *C09J 11/04* (2013.01); *C09J 11/06* (2013.01); *C09J 163/00* (2013.01); *H01L 23/293* (2013.01); *H01L 23/296* (2013.01); *C08K 5/09* (2013.01); *C08K 5/18* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2010/0016474 A1* | 1/2010 | Asano .................... | C08G 59/38 523/400 |
| 2011/0256030 A1* | 10/2011 | Barthel ..................... | B01J 19/26 422/129 |
| 2015/0175856 A1 | 6/2015 | Ishikawa et al. | |

FOREIGN PATENT DOCUMENTS

| | | | | |
|---|---|---|---|---|
| JP | 10-173103 | | 6/1998 | |
| JP | 2010-037352 A | * | 2/2010 | ............. C08G 59/58 |
| JP | 2010-265358 A | | 11/2010 | |
| WO | WO 2009/096343 A1 | | 8/2009 | |

OTHER PUBLICATIONS

Machine translation of JP 2010-037352 A (no date).*
U.S. Office Action dated Sep. 6, 2016 in U.S. Appl. No. 15/190,765; pp: 1-21.

* cited by examiner

*Primary Examiner* — Michael J Feely
(74) *Attorney, Agent, or Firm* — Muncy, Geissler, Olds & Lowe, P.C.

(57) ABSTRACT

The purpose of the present invention is to provide: a liquid sealing material which has excellent PCT (pressure cooker test) resistance; and an electronic component which is obtained by sealing a part to be sealed with use of the liquid sealing material. A liquid sealing material of the present invention contains (A) a liquid epoxy resin, (B) a curing agent, (C) a silica filler and (D) a coupling agent, and is characterized in that the boron content in the silica filler (C) has an average of 1-50 ppm.

18 Claims, No Drawings

LIQUID SEALING MATERIAL AND ELECTRONIC COMPONENT USING SAME

TECHNICAL FIELD

The present invention relates to a liquid sealing material for use as underfill. The present invention also relates to an electronic component in which portions to be sealed are sealed using the liquid sealing material.

BACKGROUND ART

As electronic components get smaller, lighter and more sophisticated, the semiconductor packaging form is changing from wire bonding type to flip-chip type.

A flip-chip semiconductor apparatus has a configuration in which electrode portions on a substrate are connected to a semiconductor device via bump electrodes. The thus configured semiconductor apparatus suffers from the following problem: When heat is applied as in temperature cycling, the bump electrodes are stressed due to a difference in coefficient of thermal expansion between the substrate made of an organic material such as epoxy resin and the semiconductor device, thus causing the bump electrodes to have defects such as cracking. In order to suppress the occurrence of such defects, it is widely performed to seal gaps between the semiconductor device and the substrate with a sealant called "underfill" to secure them to each other, thereby improving the thermal cycle resistance.

A liquid sealant for use as the underfill is required to be excellent in injection properties, adhesive properties, curing properties, storage stability and the like, and not to generate voids. In addition, a portion sealed with the liquid sealing material is required to be excellent in moisture resistance, thermal cycle resistance, reflow resistance, cracking resistance, warpage resistance and the like.

In order to satisfy the foregoing requirements, an epoxy resin-based material is widely used as the liquid sealing material for use as the underfill.

It is known that controlling the difference in coefficient of thermal expansion between a substrate made of an organic material such as epoxy resin and a semiconductor device and reinforcing bump electrodes by adding a filling material (hereinafter referred to as "filler") made of an inorganic substance such as a silica filler to a liquid sealing material are effective to improve the moisture resistance and the thermal cycle resistance, in particular the thermal cycle resistance of a portion sealed with the liquid sealing material (see Patent Literature 1).

However, with the recent trend toward narrower gaps (25 to 50 μm) and narrower pitches (up to 150 μm), the thermal cycle resistance is required to be further improved. In addition, the liquid sealing material for use as the underfill is required to also have moisture resistance and is hence required to also have excellent PCT (pressure cooker test) resistance.

CITATION LIST

Patent Literature

Patent Literature 1: JP 10-173103 A

SUMMARY OF INVENTION

Technical Problems

In order to solve the above-described prior art problems, the present invention aims at providing a liquid sealing material having excellent PCT (pressure cooker test) resistance and an electronic component in which portions to be sealed are sealed with the liquid sealing material.

Solution to Problems

In order to achieve the foregoing object, the present invention provides a liquid sealing material (1) comprising: (A) a liquid epoxy resin; (B) a curing agent; (C) a silica filler; and (D) a coupling agent,
wherein the silica filler (C) has an average boron content of 1 to 50 ppm.

In the liquid sealing material (1) of the invention, a content of the coupling agent (D) is preferably 0.1 to 5.0 wt % in terms of weight percentage with respect to a total weight of the epoxy resin (A) and the curing agent (B).

In the liquid sealing material (1) of the invention, the silica filler (C) may be previously surface-treated with a coupling agent.

In a case where the silica filler (C) is previously surface-treated with a coupling agent, a total content of the coupling agent used for surface treatment of the silica filler (C) and the coupling agent (D) is preferably 0.1 to 5.0 wt % in terms of weight percentage with respect to a total weight of the epoxy resin (A) and the curing agent (B).

The present invention also provides a liquid sealing material (2) comprising:
(A) a liquid epoxy resin; (B) a curing agent; and (C) a silica filler,
wherein the silica filler (C) has an average boron content of 1 to 50 ppm, and
wherein the silica filler (C) is previously surface-treated with a coupling agent.

In the liquid sealing material (2) of the invention, an amount of the coupling agent used for surface treatment of the silica filler (C) is preferably 0.1 to 5.0 wt % in terms of weight percentage with respect to a total weight of the epoxy resin (A) and the curing agent (B).

In the liquid sealing materials (1) and (2) of the invention, a content of the silica filler (C) is preferably 40 to 90 wt %.

In the liquid sealing materials (1) and (2) of the invention, the silica filler (C) preferably has an average particle size of 0.05 to 80 μm.

A particle size distribution at the average particle size±0.2 μm preferably accounts for at least 90% of a total.

In the liquid sealing materials (1) and (2) of the invention, the curing agent (B) is preferably an amine curing agent.

The liquid sealing materials (1) and (2) of the invention preferably further comprise (E) a curing accelerator.

The liquid sealing materials (1) and (2) of the invention preferably further comprise (F) an elastomer.

In the liquid sealing materials (1) and (2) of the invention, a rate of decrease in shear strength between before and after PCT (pressure cooker test) as expressed by an expression shown below:

Rate of decrease in shear strength between before and after PCT (%)=(shear strength before PCT−shear strength after PCT)/(shear strength before PCT)×100 is preferably up to 25%.

In the liquid sealing materials (1) and (2) of the invention, a shear strength after PCT is preferably 50 to 350 N.

The present invention also provides a semiconductor apparatus comprising: a flip-chip semiconductor device sealed with the liquid sealing materials (1) and (2) of the invention.

Advantageous Effects of Invention

The liquid sealing materials (1) and (2) of the invention are excellent in PCT resistance and are suitable as underfill in semiconductor apparatuses.

DESCRIPTION OF EMBODIMENTS

Next, the present invention is described in detail.

The liquid sealing materials (1) and (2) of the invention each contain ingredients (A) to (C) described below as essential ingredients.

(A) Liquid Epoxy Resin

A liquid epoxy resin as the ingredient (A) is an ingredient constituting a base compound of each of the liquid sealing materials (1) and (2) of the invention.

According to the invention, the liquid epoxy resin refers to an epoxy resin which is liquid at ordinary temperature.

Illustrative examples of the liquid epoxy resin in the invention include bisphenol A epoxy resins having an average molecular weight of about 400 or less; branched polyfunctional bisphenol A epoxy resins such as p-glycidyloxyphenyldimethyl trisbisphenol A diglycidyl ether; bisphenol F epoxy resins; phenol novolac epoxy resins having an average molecular weight of about 570 or less; alicyclic epoxy resins such as vinyl(3,4-cyclohexene)dioxide, (3,4-epoxycyclohexyl)methyl 3,4-epoxycyclohexylcarboxylate, bis(3,4-epoxy-6-methylcyclohexylmethyl)adipate, and 2-(3,4-epoxycyclohexyl)5,1-spiro(3,4-epoxycyclohexyl)-m-dioxane; biphenyl epoxy resins such as 3,3',5,5'-tetramethyl-4,4'-diglycidyloxybiphenyl; glycidyl ester epoxy resins such as diglycidyl hexahydrophthalate, diglycidyl 3-methylhexahydrophthalate, and diglycidyl hexahydroterephthalate; glycidyl amine epoxy resins such as diglycidylaniline, diglycidyltoluidine, triglycidyl-p-aminophenol, tetraglycidyl-m-xylylenediamine, and tetraglycidyl bis(aminomethyl)cyclohexane; as well as hydantoin epoxy resins such as 1,3-diglycidyl-5-methyl-5-ethylhydantoin; and naphthalene ring-containing epoxy resins. Silicone skeleton-containing epoxy resins such as 1,3-bis(3-glycidoxypropyl)-1,1,3,3-tetramethyldisiloxane may also be used. Other illustrative examples include diepoxide compounds such as (poly)ethylene glycol diglycidyl ether, (poly)propylene glycol diglycidyl ether, butanediol diglycidyl ether, neopentyl glycol diglycidyl ether, and cyclohexane dimethanol diglycidyl ether; and triepoxide compounds such as trimethylol propane triglycidyl ether, and glycerol triglycidyl ether.

Of these, liquid bisphenol epoxy resins, liquid aminophenol epoxy resins, silicone modified epoxy resins and naphthalene epoxy resins are preferable. Liquid bisphenol A epoxy resins, liquid bisphenol F epoxy resins, p-aminophenol liquid epoxy resins, and 1,3-bis(3-glycidoxypropyl)tetramethyldisiloxane are more preferable.

The liquid epoxy resins for the ingredient (A) may be used alone or in combination of two or more thereof.

An epoxy resin which is solid at ordinary temperature can also be used by combination use with a liquid epoxy resin if it exhibits a liquid state in the form of a mixture.

(B) Curing Agent

The curing agent as the ingredient (B) is not particularly limited as long as it is an epoxy resin curing agent. Known curing agents can be used and any of an acid anhydride curing agent, an amine curing agent and a phenolic curing agent may be used.

Specific examples of the acid anhydride curing agent that may be illustrated include alkylated tetrahydrophthalic anhydrides such as methyltetrahydrophthalic anhydride, methylhexahydrophthalic anhydride, and methyltetrahydrophthalic anhydride; hexahydrophthalic anhydride; methyl himic anhydride; succinic anhydride substituted with an alkenyl group; methyl nadic anhydride; and glutaric anhydride.

Specific examples of the amine curing agent include aliphatic polyamines such as triethylenetetramine, tetraethylenepentamine, m-xylenediamine, trimethylhexamethylenediamine, and 2-methylpentamethylenediamine; alicyclic polyamines such as isophorone diamine, 1,3-bisaminomethylcyclohexane, bis(4-aminocyclohexyl)methane, norbornene diamine, and 1,2-diaminocyclohexane; piperazine polyamines such as N-aminoethyl piperazine and 1,4-bis(2-amino-2-methylpropyl)piperazine; and aromatic polyamines such as diethyltoluenediamine, dimethylthiotoluenediamine, 4,4'-diamino-3,3'-diethyldiphenylmethane, bis(methylthio)toluenediamine, diaminodiphenylmethane, m-phenylenediamine, diaminodiphenylsulfone, diethyltoluenediamine, trimethylene bis(4-aminobenzoate), and polytetramethylene oxide-di-p-aminobenzoate. An exemplary commercial product includes T-12 (trade name; manufactured by Sanyo Chemical Industries, Ltd.) (amine equivalent: 116).

Specific examples of the phenolic curing agent include all kinds of phenolic hydroxyl group-containing monomers, oligomers and polymers, such as phenol novolac resins and their alkylated or allylated products, cresol novolac resins, phenol aralkyl (phenylene or biphenylene skeleton-containing) resins, naphthol aralkyl resins, triphenolmethane resins and dicyclopentadiene phenol resins.

Of these, amine curing agents are preferable because of their excellent moisture resistance and thermal cycle resistance. In particular, modified aromatic amines such as 3,4-dimethyl-6-(2-methyl-1-propenyl)-1,2,3,6-tephenylmethane, and bis(methylthio)toluenediamine are preferable because of their excellent storage stability.

The curing agents for the ingredient (B) may be used alone or in combination of two or more thereof.

In the liquid sealing materials (1) and (2) according to the invention, the ratio of the curing agent as the ingredient (B) to be incorporated is not particularly limited and is preferably in a range of 0.5 to 1.6 equivalents and more preferably 0.6 to 1.3 equivalents per equivalent of epoxy groups in the epoxy resin as the ingredient (A).

(C): Silica Filler

The silica filler as the ingredient (C) is added to the liquid sealing material in order to improve the moisture resistance and the thermal cycle resistance, in particular the thermal cycle resistance of a sealed portion. The thermal cycle resistance is improved by adding the silica filler because expansion and contraction of the cured liquid sealing material due to thermal cycling can be suppressed by reducing the coefficient of linear expansion.

The silica filler used as the ingredient (C) in the liquid sealing materials (1) and (2) of the invention has an average boron content of 1 to 50 ppm.

The inventors of the present application have made an intensive study on the shear strength of the liquid sealing material after PCT (pressure cooker test) and as a result found that the shear strength after PCT (pressure cooker test) significantly decreases with increasing boron content in the silica filler. The reason is not clear but the significant decrease in the shear strength is thought to be due to the following reasons: The reactivity of the respective ingredients in the liquid sealing material decreases during heating for curing with increasing boron content in the silica filler, and for example in a case where the liquid sealing material contains a silane coupling agent, the reactivity of the silane coupling agent decreases.

If the silica filler as the ingredient (C) has an average boron content of 50 ppm or less, the shear strength after PCT (pressure cooker test) does not significantly decrease.

However, too low a boron content in the silica filler as the ingredient (C) causes the silica filler to agglomerate in the liquid sealing material, thus leading to a problem of an increase in viscosity of the liquid sealing material. Therefore, the silica filler as the ingredient (C) needs to have an average boron content of 1 ppm or more.

The silica filler as the ingredient (C) preferably has an average boron content of 1 to 35 ppm, more preferably 1 to 20 ppm and even more preferably 1 to 10 ppm.

The average boron content in the silica filler can be determined by quantifying the boron content through inductively coupled plasma atomic emission spectroscopy (ICP-AES) using a sample prepared from a predetermined amount of the silica filler.

The silica filler used as the ingredient (C) in the liquid sealing material (2) of the invention is previously surface-treated with a coupling agent. This improves the dispersion stability of the silica filler in the liquid sealing material, improves the storage stability of the liquid sealing material and improves the injection properties of the liquid sealing material.

It is preferable for the silica filler used as the ingredient (C) in the liquid sealing material (1) of the invention to be also previously surface-treated with a coupling agent because the use of such silica filler improves the dispersion stability of the silica filler in the liquid sealing material, improves the storage stability of the liquid sealing material and improves the injection properties of the liquid sealing material.

A variety of coupling agents including silane coupling agents such as vinyl-based, glycidoxy-based, methacryl-based, amino-based and mercapto-based coupling agents; and titanium coupling agents such as alkoxide-based, chelate-based and acylate-based coupling agents can be used for surface treatment of the silica filler.

The silica filler surface treatment method is not particularly limited and can be performed by, for example, a stirring process, a wet process or a dry process.

The stirring process is a process in which a coupling agent and a silica filler are previously charged into a stirring device and stirred under suitable conditions. A mixer capable of stirring and mixing at a high revolution speed, as exemplified by Henschel mixer can be used as the stirring device but the stirring device used is not limited thereto.

In the wet process, a coupling agent in a sufficient amount for the surface area of a silica filler to be surface-treated is dissolved in water or an organic solvent to hydrolyze molecules of a compound constituting the coupling agent, thereby obtaining a surface treating solution. The silica filler is added to the resulting surface treating solution and the mixture is stirred to be turned into a slurry. After the coupling agent and the silica filler are sufficiently reacted by stirring, the silica filler is separated from the surface treating solution by a method such as filtration or centrifugation and dried under heating.

The dry process is a process which performs treatment by uniformly dispersing a coupling agent in the form of a stock solution or a solution in a silica filler which is being stirred at a high speed by a stirring device. A mixer capable of stirring and mixing at a high revolution speed, as exemplified by Henschel mixer can be used as the stirring device but the stirring device used is not limited thereto.

In addition to the above-described stirring, wet and dry processes, for example, an integral blend process in which a coupling agent is directly added to a silica filler dispersion obtained by dispersing a silica filler in a solvent, thereby modifying the surface of the silica filler can also be suitably used.

The amount of the coupling agent that may be used in surface treatment of the silica filler in the liquid sealing materials (1) and (2) of the invention will be described later.

The silica filler as the ingredient (C) preferably has an average particle size of 0.05 to 80 μm, more preferably 0.1 to 15 μm and even more preferably 0.1 to 3 μm from the viewpoints of viscosity adjustment of the liquid sealing material, injection properties of the liquid sealing material, prevention of occurrence of voids and the like.

The silica filler used as the ingredient (C) more preferably has an extremely narrow particle size distribution in addition to the average particle size within the foregoing range. More specifically, it is more preferable to use a silica filler in which the particle size distribution at the average particle size±0.2 μm accounts for at least 90% of the total.

The silica filler as the ingredient (C) is not particularly limited in shape but may be in any of a particle shape, a powder shape and a scale-like shape. In a case where the silica filler has a shape other than the particle shape, the average particle size of the silica filler refers to the average maximum diameter of the silica filler.

However, the silica filler preferably has a substantially spherical shape having a sphericity of 0.8 or more from the viewpoints that the dispersibility of the silica filler in the liquid sealing material and the injection properties of the liquid sealing material are improved while bringing the silica filler into a more closely packed state. The sphericity as used in the specification is defined as the ratio of the minimum diameter to the maximum diameter in a particle. As a result of observation using a scanning electron microscope (SEM), for example, the ratio of the minimum diameter to the maximum diameter observed should be 0.8 or more. The silica filler as the ingredient (C) preferably has a sphericity of 0.9 or more.

In the liquid sealing materials (1) and (2) of the invention, the content of the silica filler as the ingredient (C) is preferably in a range of 40 to 90 wt %, more preferably 45 to 80 wt % and even more preferably 50 to 70 wt % in order to reinforce bump electrodes while reducing the difference in coefficient of thermal expansion between a substrate made of an organic material such as epoxy resin and a semiconductor device.

In addition to the ingredients (A) to (C) as described above, the liquid sealing material (1) of the invention further contains an ingredient (D) described below as an essential ingredient.

(D): Coupling Agent

The liquid sealing material (1) of the invention contains a coupling agent as the ingredient (D) in order to improve the adhesion of the liquid sealing material (1) used as underfill.

A variety of coupling agents including silane coupling agents such as vinyl-based, glycidoxy-based, methacryl-based, amino-based and mercapto-based coupling agents; and titanium coupling agents such as alkoxide-based, chelate-based and acylate-based coupling agents can be used for the coupling agent as the ingredient (D).

Of these, an epoxy-based silane coupling agent is preferable because it has an excellent effect in improving the adhesion and the mechanical strength when a semiconductor resin sealing material is used as underfill.

Specific examples of the epoxy-based silane coupling agent include 3-glycidoxypropyltrimethoxysilane, 2-(3,4-epoxycyclohexyl)ethyltrimethoxysilane (trade name: KBM-303 manufactured by Shin-Etsu Chemical Co., Ltd.), 3-glycidoxypropylmethyldimethoxysilane (trade name: KBM-402 manufactured by Shin-Etsu Chemical Co., Ltd.), 3-glycidoxypropyltrimethoxysilane (trade name: KBM-403 manufactured by Shin-Etsu Chemical Co., Ltd.), 3-glycidoxypropylmethyldiethoxysilane (trade name: KBE-402 manufactured by Shin-Etsu Chemical Co., Ltd.), and 3-glycidoxypropyltriethoxysilane (trade name: KBE-403 manufactured by Shin-Etsu Chemical Co., Ltd.).

In the liquid sealing material (1) according to the invention, the content of the coupling agent as the ingredient (D) is preferably in a range of 0.1 to 5.0 wt % and more preferably 0.5 to 3.0 wt % in terms of weight percentage with respect to the total weight of the epoxy resin as the ingredient (A) and the curing agent as the ingredient (B). In a case where the silica filler as the ingredient (C) is previously surface-treated with a coupling agent in the liquid sealing material (1) of the invention, the total content of the coupling agent used for surface treatment of the silica filler and the coupling agent as the ingredient (D) preferably satisfies the foregoing range.

In the liquid sealing material (2) according to the invention, the content of the coupling agent used for surface treatment of the silica filler as the ingredient (C) is preferably in a range of 0.1 to 5.0 wt % and more preferably 0.5 to 3.0 wt % in terms of weight percentage with respect to the total weight of the epoxy resin as the ingredient (A) and the curing agent as the ingredient (B).

The liquid sealing material (1) of the invention may optionally contain ingredients to be mentioned below in addition to the foregoing ingredients (A) to (D). The liquid sealing material (2) of the invention may also optionally contain ingredients to be mentioned below in addition to the foregoing ingredients (A) to (C).

(E): Curing Accelerator

The liquid sealing materials (1) and (2) of the invention may contain a curing accelerator as an ingredient (E).

The curing accelerator as the ingredient (E) is not particularly limited as long as a curing accelerator for epoxy resin is used, and any known curing accelerator may be used. Examples of the curing accelerator include an imidazole curing accelerator (including microcapsule type and epoxy adduct type), a tertiary amine curing accelerator and phosphorus compound curing accelerator.

Of these, an imidazole curing accelerator is excellent in compatibility with the other ingredients of the semiconductor resin sealing material and in the curing rate of the semiconductor resin sealing material and is hence preferable.

Specific examples of the imidazole curing accelerator include imidazole compounds such as 2-methylimidazole, 2-undecylimidazole, 2-heptadecylimidazole, 2-ethyl-4-methylimidazole, 2-phenylimidazole, and 2-phenyl-4-methylimidazole.

An encapsulated imidazole called microcapsule imidazole or epoxy adduct imidazole may also be used. In other words, an imidazole latent curing agent encapsulated by adducting an imidazole compound with urea or an isocyanate compound and further blocking its surface with the isocyanate compound, or an imidazole latent curing agent encapsulated by adducting an imidazole compound with an epoxy compound and further blocking its surface with an isocyanate compound may also be used. To be more specific, exemplary latent curing agents include NOVACURE HX3941HP, NOVACURE HXA3042HP, NOVACURE HXA3922HP, NOVACURE HXA3792, NOVACURE HX3748, NOVACURE HX3721, NOVACURE HX3722, NOVACURE HX3088, NOVACURE HX3741, NOVACURE HX3742, and NOVACURE HX3613 (trade names; all of them are manufactured by Asahi Kasei Chemicals Corporation), AJICURE PN-40J (trade name; manufactured by Ajinomoto Fine-Techno Co., Inc.), and FUJICURE FXR-1121 (trade name; manufactured by Fuji Kasei Kogyo Co., Ltd.).

In a case where a curing accelerator is to be incorporated as the ingredient (E), the preferable content range of the curing accelerator varies with the type of the curing accelerator. The imidazole curing accelerator is more preferably incorporated in an amount of 0.05 to 50 parts by weight and even more preferably 0.1 to 30 parts by weight with respect to 100 parts by weight of the epoxy resin as the ingredient (A).

(F): Elastomer

The problem to be solved in sealing gaps between a semiconductor device and a substrate with underfill is fillet cracking.

In order to solve the problem of fillet cracking, the liquid sealing materials (1) and (2) of the invention may contain, as an ingredient (F), elastomers such as silicone rubber, butadiene rubber, styrene-butadiene rubber, and methyl methacrylate-butadiene-styrene.

In a case where an elastomer is incorporated as the ingredient (F), the content of the elastomer is preferably in a range of 3 to 55 parts by weight and more preferably 5 to 50 parts by weight with respect to 100 parts by weight of the epoxy resin as the ingredient (A).

(Other Compounding Agents)

The liquid sealing materials (1) and (2) of the invention may further optionally contain other ingredients than the foregoing ingredients (A) to (F).

Specific examples of such ingredients that may be incorporated include a metal complex, a leveling agent, a colorant, an ion trapping agent, an antifoaming agent, and a flame retardant. The type and the amount of each compounding agent to be incorporated are determined according to a conventional method.

(Preparation of Liquid Sealing Material)

The liquid sealing material (1) of the invention is prepared by mixing with stirring the above-described ingredients (A) to (D), and the ingredients (E) and (F) if they are to be incorporated, and further optionally other compounding agents to be incorporated.

The liquid sealing material (2) of the invention is prepared by mixing with stirring the above-described ingredients (A) to (C), and the ingredients (E) and (F) if they are to be incorporated, and further optionally other compounding agents to be incorporated. Mixing with stirring can be performed using a roll mill but is of course not limited to this. In a case where the epoxy resin as the ingredient (A) is solid, it is preferably liquefied or fluidized by heating or other process and mixed.

The mixing method may be appropriately changed. For example, the respective ingredients may be mixed together at a time. Alternatively, part of the ingredients may be first mixed before mixing the rest of the ingredients.

Next, the characteristics of the liquid sealing material of the invention are described.

The liquid sealing materials (1) and (2) of the invention are excellent in PCT resistance and reduction in shear strength after PCT is suppressed. More specifically, the rate of decrease in shear strength between before and after PCT as determined by the expression shown below is preferably up to 25% and more preferably up to 20%.

Rate of decrease in shear strength between before and after PCT (%)=(shear strength before PCT−shear strength after PCT)/(shear strength before PCT)×100

In addition, the liquid sealing materials (1) and (2) of the invention preferably have a shear strength after PCT of 50 to 350 N.

The liquid sealing materials (1) and (2) of the invention preferably have a viscosity of up to 250 Pa·s at ordinary temperature (25° C.) and have good injection properties when used as underfill.

The liquid sealing materials of the invention have a viscosity of more preferably up to 200 Pa·s and even more preferably up to 100 Pa·s at ordinary temperature (25° C.).

In the liquid sealing materials (1) and (2) of the invention, the flexural modulus after curing as measured according to the procedure described in Examples to be mentioned below is preferably up to 20 GPa because stress that may occur in fillet portions when they are used as underfill can be reduced to suppress occurrence of fillet cracking.

In addition, the liquid sealing materials (1) and (2) of the invention have a glass transition temperature (Tg) of 55° C. or more and are excellent in reinforcing properties of bump electrodes in a flip-chip semiconductor apparatus when used as underfill. The liquid sealing materials (1) and (2) of the invention preferably have a glass transition temperature (Tg) of 60° C. or more.

The liquid sealing materials (1) and (2) of the invention have a coefficient of thermal expansion of 15 to 50 ppm/C in a temperature range of 0 to 20° C. and are hence suitable to control the difference in coefficient of thermal expansion between a substrate made of an organic material such as epoxy resin and a semiconductor device.

The liquid sealing materials (1) and (2) of the invention are suitable for use as underfill owing to these characteristics.

The liquid sealing materials (1) and (2) of the invention may also be used in applications such as an adhesive, a solder resist and a molding agent.

Next, a method of using the liquid sealing material (1) or (2) according to the invention is described in connection with its use as underfill.

When the liquid sealing material (1) or (2) of the invention is used as underfill, the liquid sealing material (1) or (2) of the invention is filled into gaps between a substrate and a semiconductor device according to the following procedure.

When the liquid sealing material (1) or (2) of the invention is applied to one end of the semiconductor device while heating the substrate to 70 to 130° C., for example, the liquid sealing material (1) or (2) of the invention is filled into the gaps between the substrate and the semiconductor device by capillary action. In this process, the substrate may be inclined or a pressure difference may be caused between inside and outside the gaps in order to shorten the time required to fill the liquid sealing material (1) or (2) of the invention.

After the gaps are filled with the liquid sealing material (1) or (2) of the invention, the substrate is heated at a predetermined temperature for a predetermined period of time, to be more specific, at 80 to 200° C. for 0.2 to 6 hours to cure the liquid sealing material under heating, thereby sealing the gaps.

The semiconductor apparatus of the invention uses the liquid sealing materials (1) and (2) of the invention as underfill to seal portions to be sealed, in other words, gaps between a substrate and a semiconductor device according to the above-described procedure. Exemplary semiconductor devices where sealing is to be performed include, but are not particularly limited to, an integrated circuit, a large-scale integrated circuit, a transistor, a thyristor and a diode and a capacitor.

EXAMPLES

The invention is described below in further detail by way of examples. However, the invention should not be construed as being limited thereto.

Examples 1 to 22 and Comparative Examples 1 to 6

A roll mill was used to knead materials at compounding ratios shown in Tables below to prepare liquid sealing materials in Examples 1 to 22 and Comparative Examples 1 to 6. Numerical values on the respective compositions in Tables are expressed by parts by weight.

(A) Epoxy Resin
Epoxy resin A-1: Bisphenol F epoxy resin; product name: YDF8170; New Nippon Steel Chemical Co., Ltd.; epoxy equivalent: 158
Epoxy resin A-2: Bisphenol A epoxy resin; product name: 828; Mitsubishi Chemical Corporation; epoxy equivalent: 184 to 194

(B) Curing Agent
Amine curing agent B-1: 4,4'-Diamino-3,3'-diethyldiphenylmethane; product name: KAYAHARD A-A; Nippon Kayaku Co., Ltd.
Amine curing agent B-2: Diethyltrienediamine; product name: ETHACURE 100; ALBEMARLE Co., Ltd.
Acid anhydride curing agent B-3: 3,4-Dimethyl-6-(2-methyl-1-propenyl)-4-cyclohexene-1,2-dicarboxylic anhydride; product name: YH306; Mitsubishi Chemical Corporation Acid anhydride curing agent B-4: Methylhexahydrophthalic anhydride; product name: EPICLON B650; DIC Corporation Phenolic curing agent B-5: Phenol novolac resin (C) Silica Filler
Silica filler C-1: Average particle size: 1.5 μm
Silica filler C-2: Average particle size: 0.5 μm
Silica filler C-3: Average particle size: 1.5 μm The silica filler C-3 was previously surface-treated with a coupling agent by a dry process. The coupling agent used was an epoxy silane coupling agent (3-glycidoxypropyltrimethoxysilane); product name: KBM403; Shin-Etsu Chemical Co., Ltd. The amount of the coupling agent used for the surface treatment was 0.5 wt % in terms of weight percentage with respect to the total weight of the epoxy resin as the ingredient (A) and the curing agent as the ingredient (B).

(D) Coupling Agent
Coupling agent D-1: Epoxy silane coupling agent (3-glycidoxypropyltrimethoxysilane); product name: KBM403; Shin-Etsu Chemical Co., Ltd.

(E) Elastomer
Elastomer E-1: Silicone powder; product name: KMP600; Shin-Etsu Chemical Co., Ltd.

As for the silica filler in the ingredient (C), the following procedure was applied to measure the boron content and determine the average value.

The average boron content in the silica filler was determined by quantifying the boron content through inductively coupled plasma atomic emission spectroscopy (ICP-AES) using a sample prepared from a predetermined amount of the silica filler.

The thus prepared liquid sealing materials were used as evaluation samples to perform the following evaluations.

(Viscosity)

A Brookfield viscometer was used to measure the viscosity of the evaluation samples just after being prepared at a solution temperature of 25° C. and 50 rpm (10 rpm in Examples 11 and 14).

(Shear Strength)

About 0.5 mg of each evaluation sample is potted on FR-4 and a 2 mm-square silicone chip is put on the evaluation sample. The evaluation sample is allowed to stand at room temperature for 5 minutes, and then cured at 150° C. over 60 minutes by an air dryer. For the thus obtained specimen, the initial shear strength and the shear strength after it has been subjected to 20 hours of PCT (in a tank at 120° C., a humidity of 100% and 2 atm) and then allowed to stand at room temperature for 30 minutes are measured using a table top strength tester (1605HTP manufactured by Aikoh Engineering Co., Ltd.).

Measurement is made at n of 5 and the average value is deemed as a test value. The rate of decrease in shear strength between before and after PCT was determined by the following expression and was shown in Tables.

Rate of decrease in shear strength between before and after PCT (%)=(shear strength before PCT−shear strength after PCT)/(initial shear strength)×100

(Glass Transition Temperature (Tg))

Each evaluation sample was cured under heating at 165° C. for 120 minutes to obtain a cured product which was cylindrical in shape, 8 mm in diameter and 200 mm in length, and the glass transition temperature of the cured product was measured by a TMA method using TMA4000SA manufactured by Bruker ASX K.K.

(Coefficient of Thermal Expansion (CTE))

Each evaluation sample was cured under heating at 165° C. for 120 minutes to obtain a specimen (width: 15 mm; length: 40 mm), which was used to perform measurement in a range of 25° C. to 250° C. in a thermal analysis instrument (TMA4000SA manufactured by Bruker AXS K.K.) according to a tensile mode TMA process at a temperature elevation rate of 5° C./min. The average coefficient of thermal expansion was determined from the gradient of the coefficient of linear expansion in a range of 20° C. to 150° C.

(Modulus of Elasticity (Flexural Modulus)

Each evaluation sample was sandwiched between glass sheets having a parting agent applied thereto and cured at 165° C. over 120 minutes into a sheet shape with a thickness of 350 μm (size of the specimen: 10 mm×40 mm) and the flexural modulus at room temperature was determined using a universal tester (AG-I manufactured by Shimadzu Corporation).

Measurement is made at n of 3 and the average value is deemed as a test value.

The thickness and the width of the specimen are measured at 5 points and the average values are used as calculation values.

(Measurement Temperature: 15 to 30° C.)

TABLE 1

|  | Example 1 | Example 2 | Example 3 | Example 4 | Example 5 | Example 6 | Example 7 |
|---|---|---|---|---|---|---|---|
| Epoxy resin A-1 | 70 | 70 | 70 | 70 | 70 | 100 | 100 |
| Epoxy resin A-2 | 30 | 30 | 30 | 30 | 30 |  |  |
| Amino curing agent B-1 | 38 | 38 | 38 | 27 | 27 | 40 |  |
| Amino curing agent B-2 |  |  |  |  |  |  |  |
| Acid anhydride curing agent B-3 |  |  |  |  |  |  | 74 |
| Acid anhydride curing agent B-4 |  |  |  |  |  |  |  |
| Phenolic curing agent B-5 |  |  |  |  |  |  |  |
| Silica filler C-1 (boron content: 77 ppm) |  |  |  |  |  |  |  |
| Silica filler C-1 (boron content: 63 ppm) |  |  |  |  |  |  |  |
| Silica filler C-1 (boron content: 52 ppm) |  |  |  |  |  |  |  |
| Silica filler C-1 (boron content: 43 ppm) | 209 |  |  |  |  |  |  |
| Silica filler C-1 (boron content: 31 ppm) |  | 209 |  | 193 |  | 212 | 264 |
| Silica filler C-1 (boron content: 6 ppm) |  |  | 209 |  | 193 |  |  |
| Silica filler C-1 (boron content: 0 ppm) |  |  |  |  |  |  |  |
| Silica filler C-2 (boron content: 33 ppm) |  |  |  |  |  |  |  |
| Silica filler C-3 (boron content: 36 ppm) |  |  |  |  |  |  |  |
| Silane coupling agent D-1 | 1.4 | 1.4 | 1.4 | 1.3 | 1.3 | 1.7 | 1.7 |
| Elastomer E-1 |  |  |  |  |  |  |  |
| Silica filler (wt %) | 60 | 60 | 60 | 60 | 60 | 60 | 60 |
| Curing agent equivalent/Epoxy equivalent | 1.0 | 1.0 | 1.0 | 0.7 | 0.7 | 1.0 | 0.6 |
| Viscosity [Pa · s] | 61 | 59 | 62 | 54 | 59 | 68 | 46 |
| Rate of decrease in sheer strength between before and after PCT (%) | 21 | 15 | 10 | 18 | 13 | 14 | 16 |
| Evalutaion of shear strenght after PCT | Good | Good | Good | Good | Good | Good | Good |
| Tg[° C.] | 121 | 122 | 122 | 112 | 111 | 101 | 152 |
| Coefficient of thermal expansion[ppm/° C.] | 28 | 28 | 29 | 29 | 28 | 29 | 27 |
| Flexural modulus [GPa] | 9.5 | 9.5 | 9.4 | 9.5 | 9.3 | 9.4 | 9.0 |

TABLE 2

|  | Example 8 | Example 9 | Example 10 | Example 11 | Example 12 | Example 13 | Example 14 |
|---|---|---|---|---|---|---|---|
| Epoxy resin A-1 | 100 | 100 | 100 | 100 | 100 | 100 | 100 |
| Epoxy resin A-2 |  |  |  |  |  |  |  |
| Amino curing agent B-1 |  |  |  |  |  |  |  |

TABLE 2-continued

|  | Example 8 | Example 9 | Example 10 | Example 11 | Example 12 | Example 13 | Example 14 |
|---|---|---|---|---|---|---|---|
| Amino curing agent B-2 |  | 28 |  |  |  |  |  |
| Acid anhydride curing agent B-3 |  |  |  |  |  |  |  |
| Acid anhydride curing agent B-4 |  |  | 53 | 53 | 53 | 53 | 53 |
| Phenolic curing agent B-5 | 86 |  |  |  |  |  |  |
| Silica filler C-1 (boron content: 77 ppm) |  |  |  |  |  |  |  |
| Silica filler C-1 (boron content: 63 ppm) |  |  |  |  |  |  |  |
| Silica filler C-1 (boron content: 52 ppm) |  |  |  |  |  |  |  |
| Silica filler C-1 (boron content: 43 ppm) |  |  |  |  |  |  |  |
| Silica filler C-1 (boron content: 31 ppm) | 281 | 194 |  |  |  | 619 | 232 |
| Silica filler C-1 (boron content: 6 ppm) |  |  | 619 | 232 | 103 |  |  |
| Silica filler C-1 (boron content: 0 ppm) |  |  |  |  |  |  |  |
| Silica filler C-2 (boron content: 33 ppm) |  |  |  |  |  |  |  |
| Silica filler C-3 (boron content: 36 ppm) |  |  |  |  |  |  |  |
| Silane coupling agent D-1 | 1.7 | 1.5 | 1.4 | 1.4 | 1.4 | 1.4 | 1.4 |
| Elastomer E-1 |  |  |  |  |  |  |  |
| Silica filler (wt %) | 60 | 60 | 80 | 60 | 40 | 80 | 60 |
| Curing agent equivalent/Epoxy equivalent | 1.0 | 1.0 | 0.6 | 0.6 | 0.6 | 0.6 | 0.6 |
| Viscosity [Pa · s] | 59 | 57 | 671 | 117 | 59 | 654 | 128 |
| Rate of decrease in sheer strength between before and after PCT (%) | 15 | 14 | 15 | 13 | 13 | 10 | 11 |
| Evalutaion of shear strenght after PCT | Good | Good | Good | Good | Good | Good | Good |
| Tg[° C.] | 75 | 112 | 143 | 144 | 143 | 143 | 144 |
| Coefficient of thermal expansion[ppm/° C.] | 32 | 29 | 15 | 29 | 46 | 14 | 29 |
| Flexural modulus [GPa] | 9.1 | 9.4 | 19.0 | 8.8 | 5.6 | 19.4 | 8.9 |

TABLE 3

|  | Example 15 | Example 16 | Example 17 | Example 18 | Example 19 | Example 20 | Example 21 | Example 22 |
|---|---|---|---|---|---|---|---|---|
| Epoxy resin A-1 | 100 | 70 | 70 | 70 | 70 | 70 | 70 | 70 |
| Epoxy resin A-2 |  | 30 | 30 | 30 | 30 | 30 | 30 | 30 |
| Amino curing agent B-1 |  | 38 | 38 | 38 | 50 | 38 | 38 | 38 |
| Amino curing agent B-2 |  |  |  |  |  |  |  |  |
| Acid anhydride curing agent B-3 |  |  |  |  |  |  |  |  |
| Acid anhydride curing agent B-4 | 53 |  |  |  |  |  |  |  |
| Phenolic curing agent B-5 |  |  |  |  |  |  |  |  |
| Silica filler C-1 (boron content: 77 ppm) |  |  |  |  |  |  |  |  |
| Silica filler C-1 (boron content: 63 ppm) |  |  |  |  |  |  |  |  |
| Silica filler C-1 (boron content: 52 ppm) |  |  |  |  |  |  |  |  |
| Silica filler C-1 (boron content: 43 ppm) |  | 209 |  |  |  |  |  |  |
| Silica filler C-1 (boron content: 31 ppm) | 103 |  |  |  | 225 |  | 209 | 219 |
| Silica filler C-1 (boron content: 6 ppm) |  |  |  |  |  |  |  |  |
| Silica filler C-1 (boron content: 0 ppm) |  |  |  |  |  |  |  |  |
| Silica filler C-2 (boron content: 33 ppm) |  |  | 209 |  |  |  |  |  |
| Silica filler C-3 (boron content: 36 ppm) |  |  |  | 209 |  | 209 |  |  |
| Silane coupling agent D-1 | 1.4 | 1.4 | 1.4 | 1.4 | 1.4 |  | 0.15 | 6.8 |
| Elastomer E-1 |  | 20 |  |  |  |  |  |  |
| Silica filler (wt %) | 40 | 60 | 60 | 60 | 60 | 60 | 60 | 60 |
| Curing agent equivalent/Epoxy equivalent | 0.5 | 1.0 | 1.0 | 1.0 | 1.3 | 1.0 | 1.0 | 1.0 |
| Viscosity [Pa · s] | 63 | 93 | 126 | 62 | 60 | 72 | 74 | 67 |
| Rate of decrease in sheer strength between before and after PCT (%) | 11 | 16 | 15 | 15 | 15 | 15 | 16 | 15 |
| Evalutaion of shear strenght after PCT | Good | Good | Good | Good | Good | Good | Good | Good |
| Tg[° C.] | 144 | 123 | 122 | 122 | 126 | 121 | 122 | 121 |
| Coefficient of thermal expansion[ppm/° C.] | 47 | 28 | 29 | 29 | 29 | 28 | 28 | 28 |
| Flexural modulus [GPa] | 5.3 | 8.6 | 9.3 | 9.4 | 9.4 | 9.4 | 9.4 | 9.5 |

TABLE 4

|  | Comparative Example 1 | Comparative Example 2 | Comparative Example 3 | Comparative Example 4 | Comparative Example 5 | Comparative Example 6 |
|---|---|---|---|---|---|---|
| Epoxy resin A-1 | 70 | 70 | 70 | 70 | 70 | 100 |
| Epoxy resin A-2 | 30 | 30 | 30 | 30 | 30 |  |
| Amino curing agent B-1 | 38 | 27 | 38 | 38 | 38 | 40 |
| Amino curing agent B-2 |  |  |  |  |  |  |
| Acid anhydride curing agent B-3 |  |  |  |  |  |  |
| Acid anhydride curing agent B-4 |  |  |  |  |  |  |
| Phenolic curing agent B-5 |  |  |  |  |  |  |
| Silica filler C-1 (boron content: 77 ppm) | 209 | 193 |  |  |  | 212 |
| Silica filler C-1 (boron content: 63 ppm) |  |  | 209 |  |  |  |

TABLE 4-continued

|  | Comparative Example 1 | Comparative Example 2 | Comparative Example 3 | Comparative Example 4 | Comparative Example 5 | Comparative Example 6 |
|---|---|---|---|---|---|---|
| Silica filler C-1 (boron content: 52 ppm) |  |  |  | 209 |  |  |
| Silica filler C-1 (boron content: 43 ppm) |  |  |  |  |  |  |
| Silica filler C-1 (boron content: 31 ppm) |  |  |  |  |  |  |
| Silica filler C-1 (boron content: 6 ppm) |  |  |  |  |  |  |
| Silica filler C-1 (boron content: 0 ppm) |  |  |  |  | 209 |  |
| Silica filler C-2 (boron content: 33 ppm) |  |  |  |  |  |  |
| Silica filler C-3 (boron content: 36 ppm) |  |  |  |  |  |  |
| Silane coupling agent D-1 | 1.4 | 1.3 | 1.4 | 1.4 | 1.4 | 1.7 |
| Elastomer E-1 |  |  |  |  |  |  |
| Silica filler (wt %) | 60 | 60 | 60 | 60 | 60 | 60 |
| Curing agent equivalent/Epoxy equivalent | 1.0 | 0.7 | 1.0 | 1.0 | 1.0 | 1.0 |
| Viscosity [Pa · s] | 66 | 54 | 63 | 58 | Unmeasurable | 45 |
| Rate of decrease in sheer strength between before and after PCT (%) | 35 | 32 | 32 | 26 | 7 | 33 |
| Evalutaion of shear strenght after PCT | Poor | Poor | Poor | Poor | Good | Poor |
| Tg[° C.] | 122 | 111 | 121 | 121 | 122 | 100 |
| Coefficient of thermal expansion[ppm/° C.] | 28 | 28 | 29 | 28 | 29 | 29 |
| Flexural modulus [GPa] | 9.5 | 9.4 | 9.4 | 9.5 | 9.4 | 9.5 |

As for the liquid sealing materials in Examples 1 to 22, the rate of decrease in shear strength between before and after PCT is as low as up to 25% and the PCT resistance is excellent. In particular, as for the liquid sealing materials in Examples 2 to 22 in which the average boron content in the silica filler is 1 to 36 ppm, the rate of decrease in shear strength between before and after PCT is up to 20%.

In addition, the liquid sealing materials in Examples 1 to 22 had a glass transition temperature (Tg) of 55° C. or more and also had a flexural modulus of up to 20 GPa.

The liquid sealing materials in Examples 1 to 10, 12 to 13 and 15 to 22 each have a viscosity at 25° C. of up to 250 Pa·s and have good injection properties when used as underfill.

On the other hand, in Comparative Examples 1 to 4 and 6 in which the average boron content in the silica filler exceeded 50 ppm, the rate of decrease in shear strength after PCT exceeded 25% and the PCT resistance was poor. In Comparative Example 5 in which the silica filler contained no boron, agglomeration of the silica filler in the liquid sealing material occurred and the viscosity at 25° C. could not be measured.

The invention claimed is:

1. A liquid sealing material comprising:
(A) a liquid epoxy resin; (B) a curing agent selected from the group consisting of an amine curing agent, an acid anhydride curing agent and a phenolic curing agent; (C) a silica filler, which is optionally previously surface-treated with a coupling agent; and (D) a coupling agent, wherein a content of the silica filler (C) is 40 to 90 wt %,
wherein the silica filler (C) has an average boron content of 1 to 50 ppm,
wherein a total content of coupling agent used for surface treatment of the silica filler (C) and the coupling agent (D) is 0.1 to 5.0 wt % in terms of weight percentage with respect to a total weight of the epoxy resin (A) and the curing agent (B), and
wherein a ratio of the curing agent (B) to the liquid epoxy resin (A) is in a range of 0.5 to 1.6 equivalents per equivalent of epoxy groups.

2. The liquid sealing material according to claim 1, wherein a content of the coupling agent (D) is 0.1 to 5.0 wt % in terms of weight percentage with respect to a total weight of the epoxy resin (A) and the curing agent (B).

3. The liquid sealing material according to claim 1, wherein the silica filler (C) is previously surface-treated with a coupling agent.

4. The liquid sealing material according to claim 1, wherein the silica filler (C) has an average particle size of 0.05 to 80 μm.

5. The liquid sealing material according to claim 4, wherein a particle size distribution of the silica filler (C) at the average particle size±0.2 μm accounts for at least 90% of a total.

6. The liquid sealing material according to claim 1, further comprising (E) a curing accelerator.

7. The liquid sealing material according to claim 1, further comprising (F) an elastomer.

8. The liquid sealing material according to claim 1, wherein a rate of decrease in shear strength between before and after PCT (pressure cooker test) as expressed by an expression shown below:

Rate of decrease in shear strength between before and after PCT (%)=(shear strength before PCT−shear strength after PCT)/(shear strength before PCT)×100 is up to 25%.

9. The liquid sealing material according to claim 1, wherein a shear strength after PCT is 50 to 350 N.

10. A semiconductor apparatus comprising: a flip-chip semiconductor device sealed with the liquid sealing material according to claim 1.

11. A liquid sealing material comprising:
(A) a liquid epoxy resin; (B) a curing agent selected from the group consisting of an amine curing agent, an acid anhydride curing agent and a phenolic curing agent; and (C) a silica filler,
wherein the silica filler (C) has an average boron content of 1 to 50 ppm,
wherein the silica filler (C) is previously surface-treated with a coupling agent,
wherein an amount of the coupling agent used for surface treatment of the silica filler (C) is 0.1 to 5.0 wt % in terms of weight percentage with respect to a total weight of the epoxy resin (A) and the curing agent (B),
wherein a content of the silica filler (C) is 40 to 90 wt %, and
wherein a ratio of the curing agent (B) to the liquid epoxy resin (A) is in a range of 0.5 to 1.6 equivalents per equivalent of epoxy groups.

12. The liquid sealing material according to claim 11, wherein the silica filler (C) has an average particle size of 0.05 to 80 μm.

13. The liquid sealing material according to claim 12, wherein a particle size distribution of the silica filler (C) at the average particle size±0.2 μm accounts for at least 90% of a total.

14. The liquid sealing material according to claim 11, further comprising (E) a curing accelerator.

15. The liquid sealing material according to claim 11, further comprising (F) an elastomer.

16. The liquid sealing material according to claim 11, wherein a rate of decrease in shear strength between before and after PCT (pressure cooker test) as expressed by an expression shown below:

Rate of decrease in shear strength between before and after PCT (%)=(shear strength before PCT−shear strength after PCT)/(shear strength before PCT)×100 is up to 25%.

17. The liquid sealing material according to claim 11, wherein a shear strength after PCT is 50 to 350 N.

18. A semiconductor apparatus comprising: a flip-chip semiconductor device sealed with the liquid sealing material according to claim 11.

* * * * *